(12) United States Patent
Caimi et al.

(10) Patent No.: US 9,640,394 B2
(45) Date of Patent: May 2, 2017

(54) METHOD FOR FABRICATING A SEMICONDUCTOR STRUCTURE

(71) Applicant: INTERNATIONAL BUSINESS MACHINES CORPORATION, Armonk, NY (US)

(72) Inventors: Daniele Caimi, Besenbueren (CH); Lukas Czornomaz, Zurich (CH); Jean Fompeyrine, Waedenswil (CH); Emanuele Uccelli, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/835,979

(22) Filed: Aug. 26, 2015

(65) Prior Publication Data
US 2016/0064284 A1    Mar. 3, 2016

(30) Foreign Application Priority Data
Aug. 27, 2014   (GB) .................................. 1415119.5

(51) Int. Cl.
*H01L 21/02* (2006.01)
*H01L 21/8258* (2006.01)
(Continued)

(52) U.S. Cl.
CPC ...... *H01L 21/02647* (2013.01); *H01L 21/024* (2013.01); *H01L 21/02381* (2013.01);
(Continued)

(58) Field of Classification Search
CPC ......... H01L 21/02538; H01L 21/30612; H01L 21/02455; H01L 21/02639;
(Continued)

(56) References Cited

U.S. PATENT DOCUMENTS 7,129,126 B2 * 10/2006 Steegen ............ H01L 21/02381
257/E21.129
8,274,097 B2    9/2012 Cheng
(Continued)

FOREIGN PATENT DOCUMENTS

JP    2013535090 A    9/2013
WO   20070112066 A2  10/2007
WO    2009112066 A2   9/2009

OTHER PUBLICATIONS

Allon I. Hochbaum et. al., Controlled Growth of Si Nanowire Arrays for Device Intergration, Nano Letters, Jan. 26, 2005, pp. 457-460, vol. 5-No. 3, American Chemical Society, Washington D.C., USA. <http://pubs.acs.org/doi/abs/10.1021/nl047990x/>.
(Continued)

*Primary Examiner* — Joseph C Nicely
(74) *Attorney, Agent, or Firm* — Mercedes Hobson

(57) ABSTRACT

Method for fabricating a semiconductor structure. The method includes: providing a crystalline silicon substrate; defining an opening in a dielectric layer on the crystalline silicon substrate, the opening having sidewalls and a bottom wherein the bottom corresponds to a surface of the crystalline silicon substrate; providing a confinement structure above the dielectric layer, thereby forming a confinement region between the confinement structure and the dielectric layer; and growing a crystalline compound semiconductor material in the confinement region thereby at least partially filling the confinement region. The present invention also provides an improved compound semiconductor structure and a device for fabricating such semiconductor structure.

17 Claims, 8 Drawing Sheets

(51) Int. Cl.
*H01L 29/16* (2006.01)
*H01L 29/20* (2006.01)
*H01L 29/22* (2006.01)
*H01L 21/306* (2006.01)

(52) U.S. Cl.
CPC .. *H01L 21/02387* (2013.01); *H01L 21/02455* (2013.01); *H01L 21/02521* (2013.01); *H01L 21/02538* (2013.01); *H01L 21/02639* (2013.01); *H01L 21/02664* (2013.01); *H01L 21/30612* (2013.01); *H01L 21/8258* (2013.01); *H01L 29/16* (2013.01); *H01L 29/20* (2013.01); *H01L 29/22* (2013.01)

(58) Field of Classification Search
CPC ............. H01L 21/02387; H01L 21/024; H01L 21/02647; H01L 21/02365; H01L 21/02428; H01L 21/02436; H01L 29/20
See application file for complete search history.

(56) References Cited

U.S. PATENT DOCUMENTS

| | | | |
|---|---|---|---|
| 8,384,196 | B2 | 2/2013 | Cheng et al. |
| 2003/0186475 | A1* | 10/2003 | Ueda ................ H01L 21/76251 438/22 |
| 2005/0054180 | A1* | 3/2005 | Han ................. H01L 21/02381 438/479 |
| 2006/0131606 | A1 | 6/2006 | Cheng |
| 2007/0099329 | A1* | 5/2007 | Maa ...................... H01L 31/105 438/57 |
| 2008/0001169 | A1* | 1/2008 | Lochtefeld .......... H01L 21/2018 257/190 |
| 2009/0321882 | A1* | 12/2009 | Park ................... H01L 21/0237 257/615 |
| 2011/0006368 | A1* | 1/2011 | Hata ................. H01L 21/02381 257/347 |
| 2011/0049568 | A1 | 3/2011 | Lotchefeld et al. |
| 2011/0204378 | A1 | 8/2011 | Su et al. |
| 2011/0221039 | A1* | 9/2011 | Singh ................... C30B 25/186 257/615 |
| 2012/0025195 | A1 | 2/2012 | McComber et al. |
| 2014/0091360 | A1 | 4/2014 | Pillarisetty et al. |
| 2015/0255608 | A1* | 9/2015 | Cai ..................... H01L 29/7849 438/283 |
| 2016/0087160 | A1* | 3/2016 | Cheng ...................... G02B 6/42 257/13 |
| 2016/0155798 | A1* | 6/2016 | Borg ................. H01L 21/02381 257/618 |
| 2016/0190206 | A1* | 6/2016 | Tsai ..................... H03H 9/0542 257/416 |

OTHER PUBLICATIONS

M. Caymax et. al., Selective Epitaxial Growth of III-V Semiconductor Heterostructures on Si Substrates for Logic Applications, ECS Transactions, 2010, pp. 933-939, vol. 33-6, The Electrochemical Society, Pennington, USA. <http://orbi.ulg.ac.be/handle/2268/69092>.

P.J. Schubert et. al., Confined Lateral Selective Epitaxial Growth of Silicon for Device Fabrication, Electron Device Letters, May 1990, vol. 11-Iss. 5, IEEE, West Lafayette, IN, USA. <http://ieeexplore.ieee.org/xpl/articleDetails.jsp?arnumber=55243&tag=1/>.

M. Bartek et. al., Confined Selective Epitaxial Growth: Potential for Smart Silicon Sensor Fabrication, The 8th International Conference on Solid-State Sensors and Actuators, Jun. 25, 1995, vol. 1, IEEE, DELFT, The Netherlands. <http://ieeexplore.ieee.org/xpl/articleDetails.jsp?arnumber=717099/>.

B. Gerard et. al., Stress Distribution Mapping of GaAs on Si Conformal Layers, Journal of Applied Physics, Mar. 1, 2007, vol. 101-Iss. 5, American Institute of Physics, Published Online. <http://scitation.aip.org/content/aip/journal/jap/101/5/10.1063/1.2436840/>.

\* cited by examiner

… (1)

METHOD FOR FABRICATING A SEMICONDUCTOR STRUCTURE

CROSS-REFERENCE TO RELATED APPLICATION

This application claims priority under 35 U.S.C. §119 from UK Application No. 1415119.5 filed Aug. 27, 2014, the entire contents of which are incorporated herein by reference.

FIELD OF INVENTION

This present invention relates to semiconductor structure. More particularly, it is directed to improved methods for fabricating semiconductor structures where the compound semiconductor material and the silicon substrate material are lattice mismatched.

BACKGROUND OF THE INVENTION

Silicon is the basic material for present solid-state electronics, and processing techniques for silicon have been evolved for decennials. Hence, most electronic integrated circuit devices are based on silicon. However, there are disadvantages to silicon such as the relatively low charge carrier mobility and its indirect band gap, which limit the use of silicon especially in opto-electronic applications. It would be advantageous to combine more suitable semiconductor materials, such as III-V or IV-IV compound semiconductors with silicon-based electronics on common silicon substrates.

A monolithic integration of compound semiconductors on silicon wafers is desirable and has extensively been investigated in the past. Several problems need to be overcome when compound semiconductors and conventional silicon technologies are being combined. First, there is a large lattice mismatch between a crystalline silicon substrate and compound semiconductor crystals. Further, there is a thermal expansion coefficient mismatch between the silicon wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to considerably reduce the defect density.

Techniques to combine compound semiconductor materials with conventional silicon wafers include bonding techniques such as direct wafer bonding. In direct wafer bonding, a compound hetero-structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline (dielectric) sidewalls. The prior art (U.S. Pat. No. 8,173,551 B2) discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of Germanium microcrystals grown in silicon oxide trenches on a silicon substrate with a gallium arsenide film on top.

The prior art also teaches another ART approach (U.S. Pat. No. 8,384,196 B2) that employs an additional epitaxial layer overgrowth (ELO) of the trenches. Relatively thick compound semiconductor or germanium layers are obtained on the trench-forming dielectric, and the crystalline compound or germanium is preferably planarized prior to further processing.

It is therefore desirable to provide improved devices including lattice mismatched crystalline semiconductor materials and methods for fabricating such.

BRIEF SUMMARY OF THE INVENTION

The present invention provides an improved method for fabricating semiconductor structures based on a crystalline semiconductor material grown on or above a crystalline semiconductor substrate wherein the semiconductor material and the semiconductor substrate material have a lattice mismatch. In particular, III-V compound semiconductor materials on silicon substrate structures are desirable. The present invention also provides an improved compound semiconductor structure and a device for fabricating such semiconductor structure.

The present invention provides a method for fabricating a semiconductor structure. The method includes: providing a crystalline silicon substrate and defining an opening in a dielectric layer on the crystalline silicon substrate. The opening has sidewalls and a bottom, wherein the bottom corresponds to a surface of the crystalline silicon substrate. The method also includes: providing a confinement structure above the dielectric layer, thereby forming a confinement region between the confinement structure and the dielectric layer; and growing a crystalline compound semiconductor material in the confinement region, thereby at least partially filling the confinement region.

The present invention also provides a semiconductor structure that includes: a crystalline silicon material substrate; a dielectric layer on the crystalline silicon substrate having an opening that has sidewalls and a bottom, wherein the bottom corresponds to a surface of this crystalline silicon substrate; and a crystalline compound semiconductor layer at least partially covering the dielectric layer, thereby forming a processable crystalline compound semiconductor substrate, wherein the bottom of the opening is isolated from the crystalline compound material.

Additionally, the present invention provides a device for crystalline compound semiconductor growth, the device includes: a crystalline silicon material substrate; a dielectric layer on the crystalline silicon substrate having an opening that has sidewalls and a bottom. The bottom of the opening corresponds to a surface of the crystalline silicon substrate and the bottom acts as a growth seed for a compound semiconductor material. Further, the device includes: a confinement structure arranged in a spaced relationship with the dielectric layer and the bottom of the opening thereby forming a confinement region, wherein the confinement region extends laterally from the sidewalls of the opening between the confinement structure and the dielectric layer.

BRIEF DESCRIPTION OF THE DRAWINGS

Through the more detailed description of some embodiments of the present invention in the accompanying drawings, the above and other objects, features and advantages of the present invention will become more apparent, wherein the same reference generally refers to the same components in the embodiments of the present invention.

DETAILED DESCRIPTION OF THE PREFERRED EMBODIMENTS

Some preferable embodiments will be described in more detail with reference to the accompanying drawings, in which the preferable embodiments of the present invention have been illustrated. However, the present invention can be implemented in various manners, and thus should not be construed to be limited to the embodiments illustrated herein. The embodiments provided are for the thorough and complete understanding of the present invention in order to completely convey the scope of the present invention to those skilled in the art.

Figure 1:
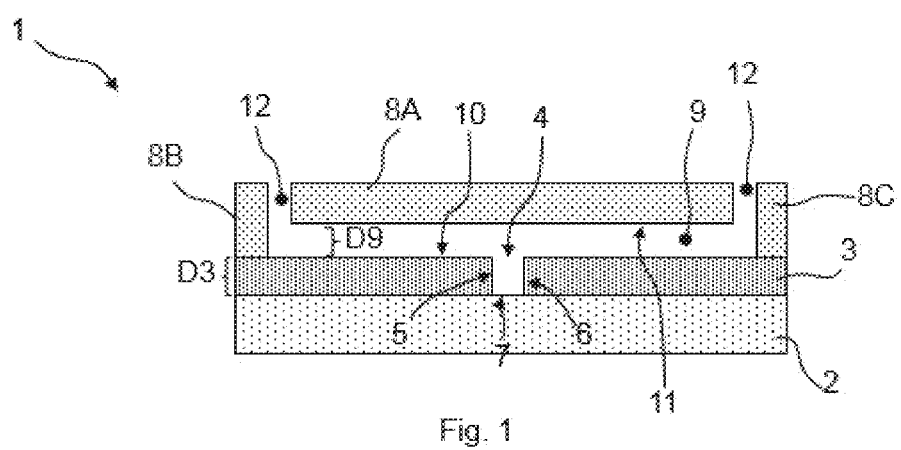
FIG. 1 shows a schematic diagram of a first embodiment of device for growing a crystalline compound semiconductor.

FIG. 1 shows a schematic diagram of an embodiment of a device for growing a crystalline compound semiconductor material. Device 1 includes: crystalline silicon substrate 2 that is covered by dielectric material 3 such as silicon oxide. Dielectric layer 3 has thickness D3, and opening 4 is formed having bottom 7 that corresponds to silicon substrate 2 and sidewalls 5, 6. Opening 4 can have rectangular or other shapes.

Device 1 further includes: confinement structure 8A, 8B, 8C forming and limiting confinement region 9. Confinement region 9 extends above dielectric layer 3 and is essentially confined by upper confinement surface 11 and lower confinement surface 10. Lower confinement surface 10 corresponds to the surface of dielectric layer 3 facing towards an essentially flat and self-supporting cap layer 8A. Surface 11 of cap layer 8A facing towards dielectric layer 3 forms upper confinement surface 11. Distance D9 between upper and lower confinement surface 11, 10 can be between 5 and 100 nm. Confinement structure further includes support or spacer members 8B, 8C (shown in a cross-sectional view) that can support cap layer 8A at specified distance D9.

Openings or inlets 12 in the confinement structure allow for inserting a material into confinement region 9. Confinement region 9 is an essentially flat cavity or void region and is surrounded by a dielectric material such as silicon oxide, except for bottom 7 of opening 4. Dielectric layer 3 has thickness D3 of 10-200 nm. Preferably, an aspect ratio, the ration between the width and height (thickness D2), of opening 4 is less than 1. However, one can contemplate of other dimensions.

Openings or inlets 12 have an extension of between 20 and 200 nm. Cap portion 8A can have a thickness of between 25 and 500 nm. In specific examples, the thickness is around 80-100 nm.

Device 1 is suitable for growing a compound semiconductor material such as a III-V semiconductor starting from bottom 7 of opening 4. This is because the silicon of crystalline substrate 2 may act as a growth seed for epitaxial lateral growth of the semiconductor compound material. In particular, an overgrowth of opening 4 can occur, thereby growing laterally above and confined through upper and lower confinement surfaces 11, 10 on dielectric layer 3. As a result of the epitaxial growth of the compound material an essentially flat and defect-free compound substrate is generated in the void of confinement region 9 on dielectric layer 3.

Figure 2:
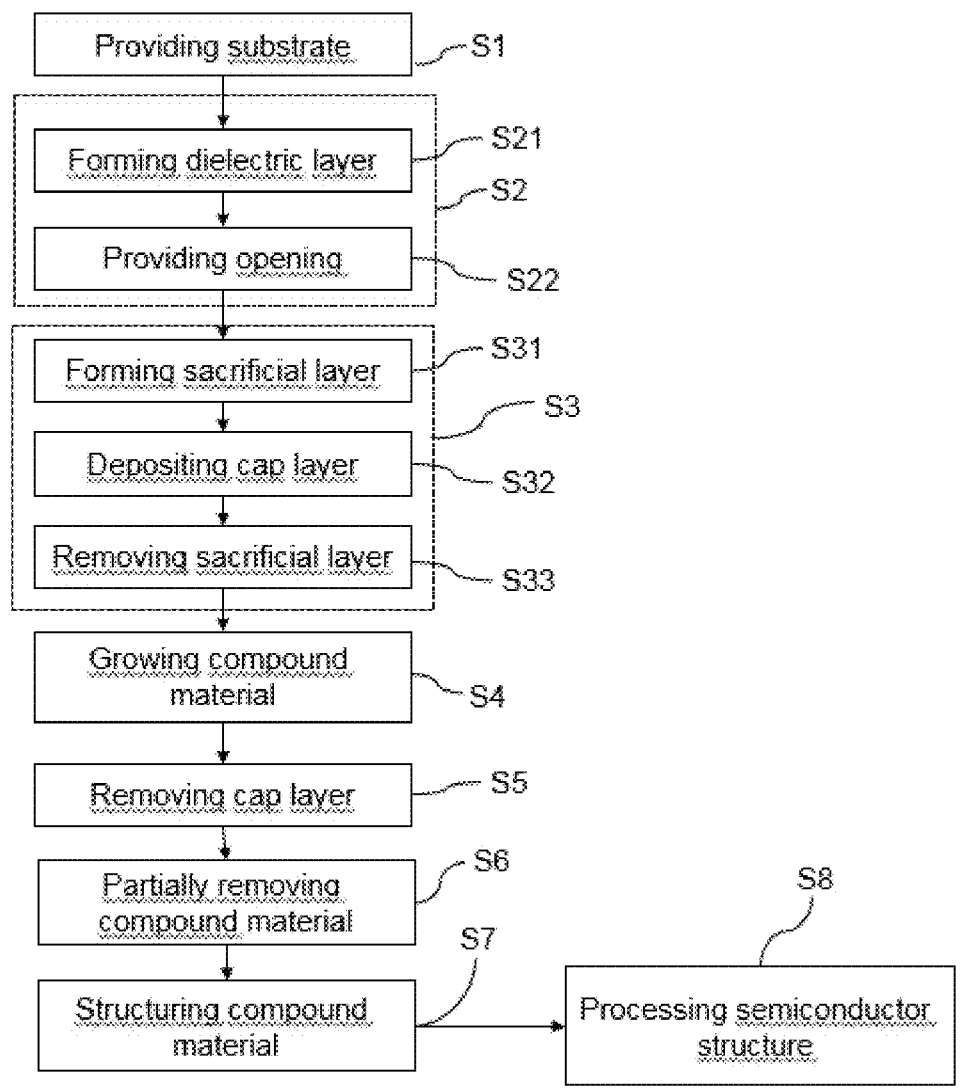
FIG. 2 shows a flow chart of method steps involved in a method for fabricating a semiconductor structure.

Referring to FIG. 2, a flowchart of an embodiment of a method for manufacturing a semiconductor structure including a silicon substrate and a compound semiconductor material is shown. One can employ the device as shown in FIG. 1. The method is suitable for generating a III-V semiconductor compound material having only few crystalline defects on a silicon substrate. FIGS. 3-8 illustrate the involved method steps and show embodiments of the respective semiconductor structures.

Figure 3:
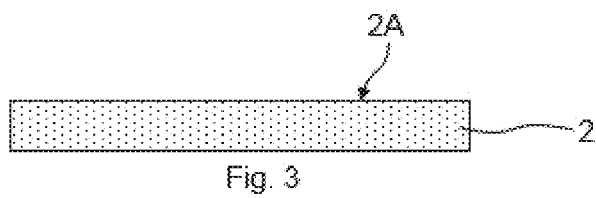
FIG. 3 shows a schematic diagram illustrating a silicon substrate involved during process steps for manufacturing embodiments of semiconductor structures.

In first step S1, a substrate is provided as shown in FIG. 3. Substrate 2 is a crystalline semiconductor such as silicon. A substrate can be part of a silicon wafer with clean and flat surface 2A. The substrate is a crystalline semiconductor or a compound semiconductor wafer of a large diameter. The wafer can be a material from group IV of the periodic table. Materials of group IV can include silicon, germanium, mixed silicon and germanium, mixed silicon and carbon, mixed silicon, germanium and carbon and similar combinations. For example, substrate 2 corresponds to a crystalline silicon wafer that is used in the semiconductor industry. Substrate 2 can be a miscut silicon (001) substrate. A crystalline silicon wafer in the orientation (001) may reduce dislocations and results in an improved quality of subsequently grown layers on substrate 2.

Figure 4:
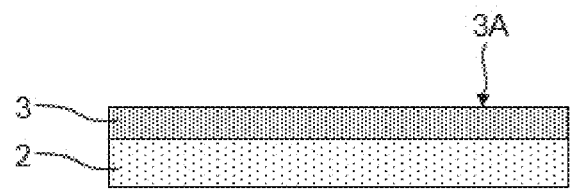
FIG. 4 shows a schematic diagram illustrating a silicon substrate and a dielectric layer involved during process steps for manufacturing embodiments of semiconductor structures.
Figure 5:
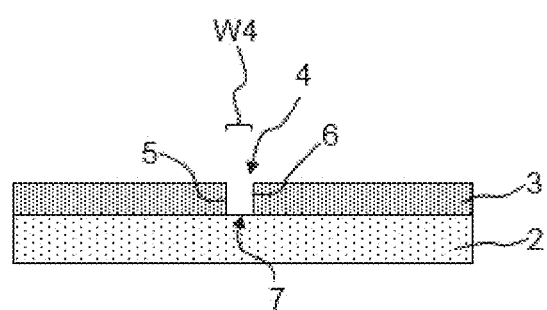
FIG. 5 shows a schematic diagram illustrating a silicon substrate, a dielectric layer, side walls and an opening involved during process steps for manufacturing embodiments of semiconductor structures.

Step S2 of FIG. 2 refers to FIGS. 4 and 5, which show an opening in a dielectric layer on the crystalline silicon substrate. Step S21 of FIG. 2 corresponds to FIG. 4, which illustrates that dielectric layer 3 is formed above substrate 2 using a non-crystalline amorphous material. Dielectric layer 3 can be formed by known methods such as thermal oxidation, chemical vapor deposition (CVD), plasma enhanced CVD (PECVD), atomic layer deposition, chemical solution deposition, MOCVD, evaporation, sputtering and other like deposition processes. Examples of dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof. For example, one can oxidize a surface region of silicon substrate 2 to obtain silicon oxide as dielectric layer 3.

Next Step S22 of FIG. 2 corresponds to FIG. 5, which shows opening 4 formed in the dielectric layer 3. For example, a dry-etching and/or other lithography technique can be used to create, manufacture or define opening 4 having width W4 in dielectric layer 3. Any anisotropic etching technique is suitable. Bottom 7 of opening 4 corresponds to surface 2A of crystalline silicon 2. Vertical sidewalls 5, 6 are shown in FIG. 5. Eventually, the crystalline silicon in opening 4 can be used as a growth seed for a semiconductor compound material.

In step S3, a confinement structure is provided above the dielectric layer as shown in FIG. 1. The confinement structure 8A, 8B, 8C can be formed by depositing a sacrificial layer as a negative mold, forming a cap layer and removing the sacrificial layer, as will be explained below. As shown in FIG. 1, a device for compound semiconductor growth is obtained.

Confinement structure 8A, 8B, 8C is provided or formed in a spaced relationship with dielectric layer 3 and bottom 7 of opening 4, thereby forming confinement region 9. Confinement region 9 extends above and laterally from sidewalls 5, 6 of the opening 4 between the confinement structure 8A, 8b, 8C and the dielectric layer 3.

Next, a compound semiconductor material is inserted through inlets 12 and crystal compound semiconductor material grows selectively from the seed (i.e. bottom 7 of opening 4). Compound semiconductor material 13 can include a compound semiconductor which can be selected as needed for a particular semiconductor structure from any type of IIIA and VA elements (III-V semiconductor compounds), mixed III-V compounds, group II (A or B) and VIA elements (II-VI semiconductor compounds) and mixed II-VI compounds, and IV-VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and similar compounds.

Figure 6:
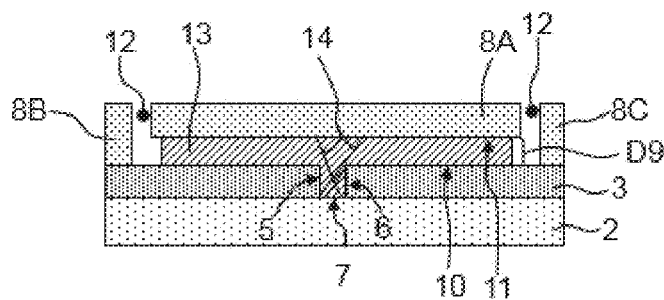
FIG. 6 shows a schematic diagram illustrating a silicon substrate, a dielectric layer, a crystalline compound semiconductor material, and a confinement structure involved during process steps for manufacturing embodiments of semiconductor structures.

Compound semiconductor material 13 filling the opening can be formed by selective epitaxial growth in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed. A substantial epitaxial lateral overgrowth of opening 4 may occur as shown in FIG. 6.

For example, MOCVD is used to epitaxially grow indium gallium arsenide ($In0.5-0.7GaAs$) in step S4, first in opening 4 and eventually to overgrow the opening to fill the entire or at least parts of confinement region 9. As shown in FIG. 6, potential crystal defects are indicated as straight lines 14 that grow at specific angles and terminate at the interface with the dielectric of dielectric layer 3 and on upper confinement surface 11. As a result, defects 14 cannot grow into the lateral areas that are to the left and right of opening 4. As a result, clean and almost defect-free crystal compound semiconductor material 13 is grown in a layered fashion between dielectric layer 3 and cap portion 8A.

Figure 7:
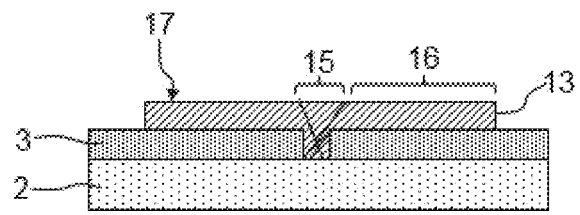
FIG. 7 shows a schematic diagram illustrating a silicon substrate, a dielectric layer, a crystalline compound semiconductor material, and a compound surface involved during process steps for manufacturing embodiments of semiconductor structures.

In step S5, illustrated in FIG. 7, the confinement structure is removed. In particular, cap layer 8A and the remainder of confinement structure 8B, 8C are removed using a plasma-etching step. However, one can also use wet etching. It is shown in FIG. 7 that III-V compound material 13 exhibits surface structure 17 that corresponds to the surface structure of initial upper confinement surface 11.

In the area above opening 4, defect region 15 may occur that can be removed by further selective etching. However, clean and extremely flat compound semiconductor material 13 is obtained in clean region 16 away from the opening. The thickness of compound semiconductor layer 13 corresponds to distance D14 between dielectric layer 3 and cap confinement portion 8A. For example, the thickness can be between 10 and 40 nm. A surface roughness of semiconductor compound layer 13 is preferably 1 nm or less.

Figure 8:
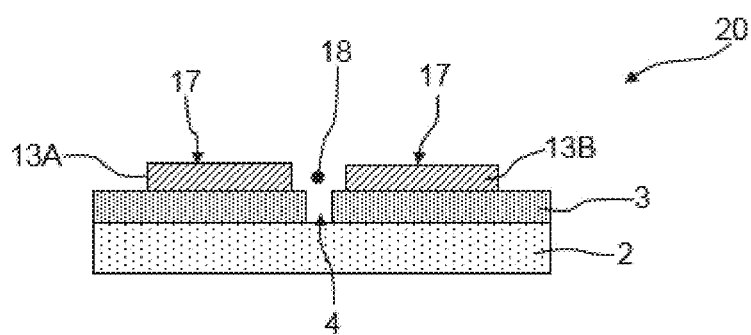
FIG. 8 shows a schematic diagram illustrating a silicon substrate, a dielectric layer, a crystalline compound semiconductor material, compound surfaces and a recess/void involved during process steps for manufacturing embodiments of semiconductor structures.

In step S6, the compound material is partially removed. This is illustrated in FIG. 8. Recess 18 is formed above opening 4. Semiconductor compound material 13A, 13B is isolated from silicon substrate 2 and from bottom 7 of opening 4. As a result, two essentially flat and thin compound semiconductor substrates 13A, 13B for further processing are obtained. Surface 17 of the compound semiconductor material can have a roughness of less than 0.5 nm. This is obtained without planarizing or polishing techniques. Finally, semiconductor structure 20 is obtained that includes a compound semiconductor layer on silicon oxide and a silicon substrate.

In Step S7 and S8, one can eventually structure the compound material or process the entire structure to obtain electric or opto-electric components. The fabrication method enables a direct integration of compound materials such as III-V semiconductors on a large silicon wafer. One obtains a low defect density due to the planar geometry of the confinement structure and the CELO growth approach. By tuning the distance between the confinement surfaces, the thickness of the compound material can easily be controlled. In comparison to conventional overgrowth techniques, the method allows for an efficient material use of the compound semiconductor.

Figure 9:
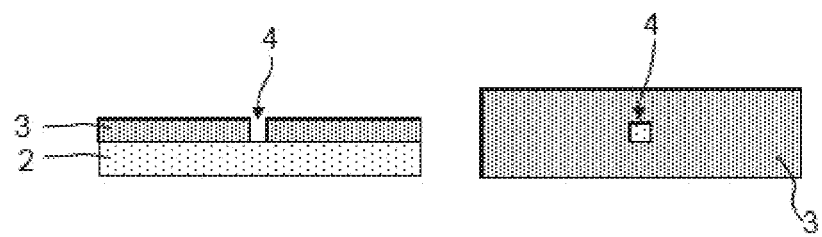
FIG. 9 shows a schematic diagram illustrating a side view and a top view of a silicon substrate, a dielectric layer and an opening involved during process steps for manufacturing further embodiments of semiconductor structures.

Next, an example for a method for manufacturing a compound semiconductor device using confined epitaxial lateral overgrowth is illustrated with respect to FIGS. 9-17. The left-hand side shows a cross-sectional view, while the right-hand side shows a top view of the structure during manufacture. First, a crystalline silicon wafer as provided as substrate 2 is shown in FIG. 9. A dielectric layer is formed, for example, including silicon dioxide obtained through dry-oxidation of the silicon wafer. The dielectric layer 3 defines an opening 4 reaching the substrate surface.

Figure 10:
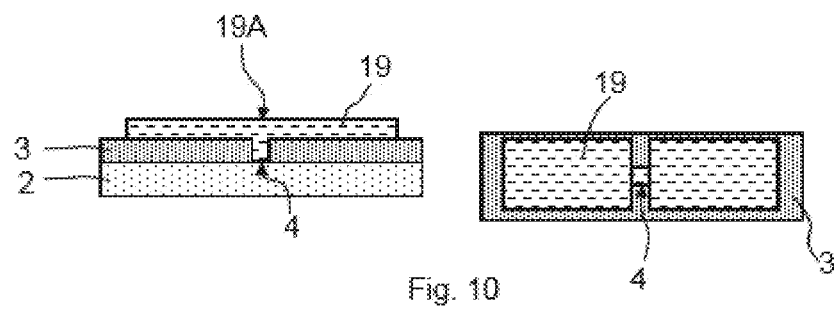
FIG. 10 shows a schematic diagram illustrating a side view and a top view of a silicon substrate, a dielectric layer, an opening and sacrificial layers involved during process steps for manufacturing further embodiments of semiconductor structures.
Figure 11:
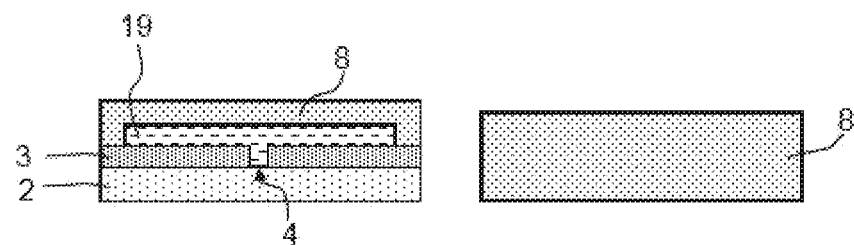
FIG. 11 shows a schematic diagram illustrating a side view and a top view of a silicon substrate, a dielectric layer, an opening, sacrificial layers and a confinement structure involved during process steps for manufacturing further embodiments of semiconductor structures.

FIGS. 10-13 provide a more detailed picture of fabricating the confinement structure in terms of steps S31-S33 from FIG. 2. Sacrificial layer 19 is deposited and patterned onto dielectric layer 3, filling opening 4. For example, sacrificial layer 19 can be amorphous silicon, but one can also use polymers or other suitable materials that can eventually be removed. Sacrificial layer 19 has upper surface 19A which is flat and has low roughness. The right hand side of FIG. 10 shows left and right portions of sacrificial layer 19 that have a rectangular shape.

Next, the confinement structure is deposited onto the sacrificial layer. Confinement structure 8 is at least partially formed, for example of an oxide, such as silicon oxide. Sacrificial layer material 19 is then enclosed by confinement material 8.

Figure 12:
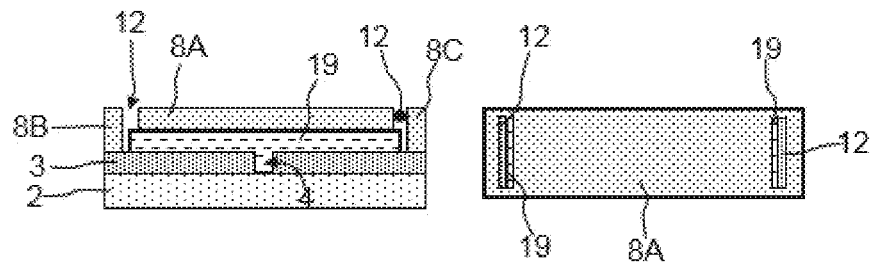
FIG. 12 shows a schematic diagram illustrating a side view and a top view of a silicon substrate, a dielectric layer, an opening, sacrificial layers, inlets and a confinement structure involved during process steps for manufacturing further embodiments of semiconductor structures.
Figure 13:
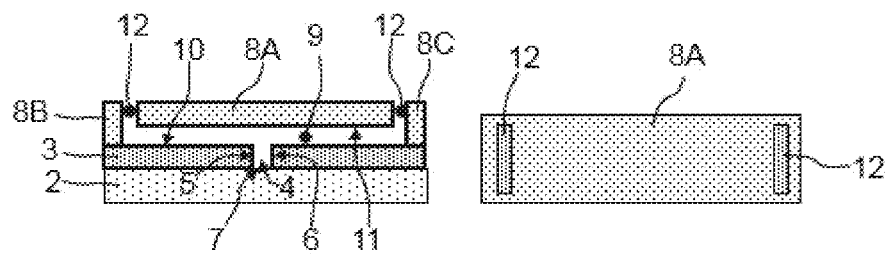
FIG. 13 shows a schematic diagram illustrating a side view and a top view of a silicon substrate, a dielectric layer, an opening, inlets, a confinement growth surface and a confinement structure involved during process steps for manufacturing further embodiments of semiconductor structures.

Next, as shown in FIG. 12, openings are formed through an anisotropic etching process wherein the openings act as inlets 12 reaching through cap oxide layer 8A. Confinement structure 8A, 8B, 8C resembles the geometry as shown in FIG. 1. In the top view of FIG. 12, inlets 12 have a rectangular shape.

Next, the sacrificial layer is removed. This can be done, for example, by suitable etching techniques. The removal of the sacrificial layer 19 material may depend on the material used. There are, for example, etching techniques available that selectively remove amorphous silicon as sacrificial material. As a result, after removing sacrificial material 19 shown in FIG. 13, a device similar to the one shown in FIG. 1 is obtained.

Figure 14:
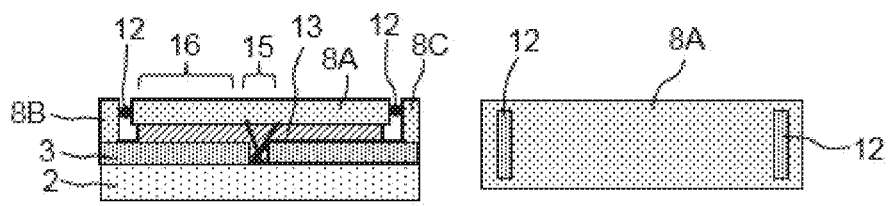
FIG. 14 shows a schematic diagram illustrating a side view and a top view of a silicon substrate, a dielectric layer, an opening, inlets, a crystalline compound semiconductor material and a confinement structure involved during process steps for manufacturing further embodiments of semiconductor structures.

Next, by use of metal-organic vapor deposition, a III-V compound semiconductor material such as indium gallium arsenide (In0.5-0.7GaAs) is grown in confinement region 9. The opening and bottom 7 act as a growth seed for the compound material. A selective epitaxial growth of the compound material is performed in the confinement area. In FIG. 14, defects essentially remain in the vicinity of the opening and do not propagate into flat regions 16.

Figure 15:
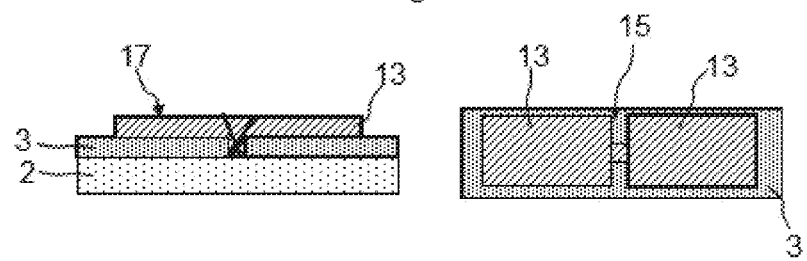
FIG. 15 shows a schematic diagram illustrating a side view and top view of a silicon substrate, a dielectric layer, a crystalline compound semiconductor material, and a compound surface involved during process steps for manufacturing further embodiments of semiconductor structures.

Next, as shown in FIG. 15, the confinement structure including support portions 8B and 8C and cap layer 8A is removed. For example, this can be done by plasma etching techniques or wet etching steps. Compound semiconductor structure 13 on silicon oxide 3 as dielectric is obtained. In order to isolate crystalline compound material 13 from substrate 2 (i.e. the crystalline silicon), recess 18 is formed where opening 4 is situated.

Figure 16:
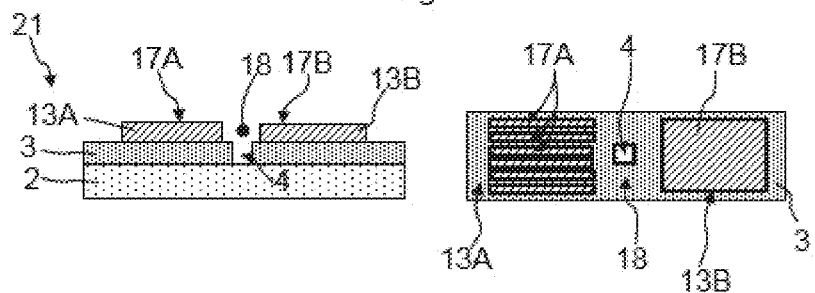
FIG. 16 shows a schematic diagram illustrating a side view and top view of a silicon substrate, a dielectric layer, a crystalline compound semiconductor material, compound surfaces and a recess/void involved during process steps for manufacturing further embodiments of semiconductor structures.

Referring to FIG. 16, left and right rectangular compound patches are formed. Employing lithographic steps, one can further structure compound material layers 13A, 13B. For example, on the right-hand side of FIG. 16, the left compound layer is structured in terms of fins such as for fabricating a fin field effect transistor (FET). The right-hand side can be used for manufacturing a planar FET. The III-V compound material regions are active regions that can be structured in terms of a dry etching process. One can further process semiconductor structure 21 shown in FIG. 16 to obtain electric or opto-electronic components such as planar or trigate MOSFETs, laser devices, detector devices or photonic devices.

Figure 17:
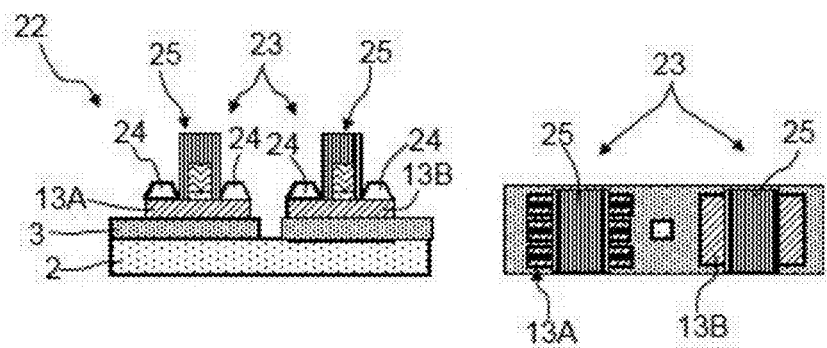
FIG. 17 shows a schematic diagram illustrating a side view and top view of a silicon substrate, a dielectric layer, a crystalline compound semiconductor material, a recess/void, and FETs involved during process steps for manufacturing further embodiments of semiconductor structures.

FIG. 17 shows a field effect transistor structure using compound material 13A, 13B as active regions wherein doped contacts 24 and gate structure 25 are structured according to conventional techniques on the compound semiconductor region. The devices have a high quality crystalline III-V compound material as active regions for the electric or opto-electric components. Extremely thin layers can be obtained employing standard processes as depicted above.

Figure 18:
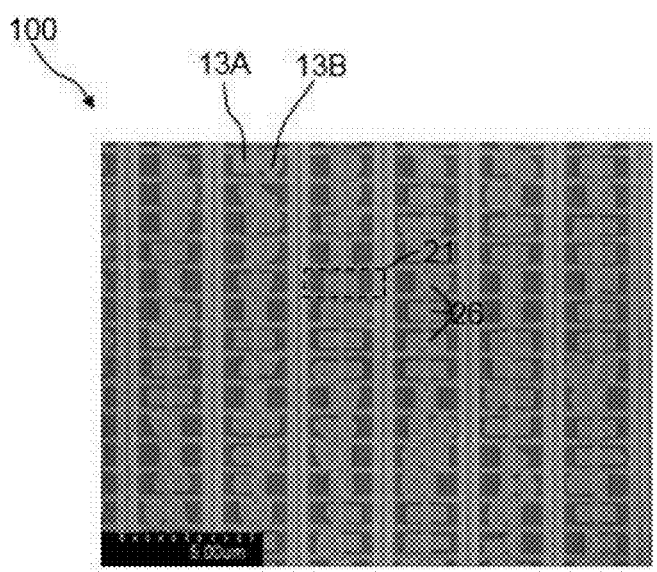
FIG. 18 shows a scanning electron microscope (SEM) image of an embodiment of a wafer structure including embodiments of semiconductor structures.

FIG. 18 shows a scanning electron microscope image of an embodiment of a wafer structure including a plurality of III-V compound structures on silicon. FIG. 18 shows a top view of a section of wafer 100 with plurality of structures 21 similar to the structures shown in FIGS. 15 and 16. The grey patches correspond to III-V compound material. An exemplary structure is indicated in dashed rectangle 21. Three seed positions 26 (i.e. a view through the respective recess onto the silicon substrate) are indicated between the rectangular patches of III-V semiconductor compound materials 13A, 13B.

Figure 19:
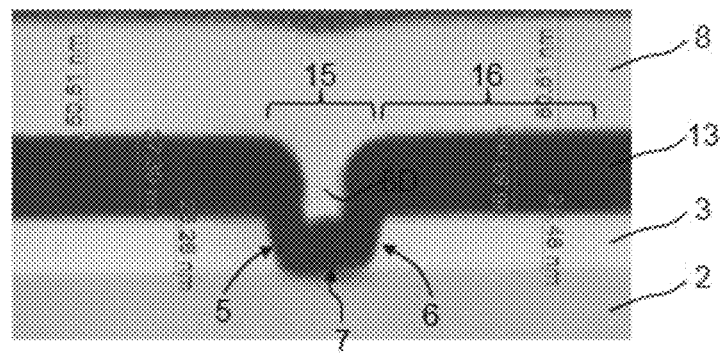
FIG. 19 shows a transmission electron microscope (TEM) image of a cross-sectional view of a region in an embodiment of a semiconductor structure.

FIG. 19 shows a cross-sectional view of a microscopic image of a seed region or an opening filled with compound semiconductor material in a device. In FIG. 19, silicon substrate 2 is followed by dielectric layer 3 that has an opening including bottom 7 and sidewalls 5, 6. Above dielectric layer 3, a second dielectric layer forming confinement structure 8 is arranged. Between confinement structure 8 that has protrusion 8D facing towards bottom 7 of the opening, semiconductor compound material 13 is grown. The central area below protrusion 8D may include crystal defects of III-V compound material 13. Left and right from the opening, almost defect-free clean regions 16 of compound material 13 are obtained.

In the embodiment shown in FIG. 19, the thickness of dielectric layer 3 is roughly 25 nm. The thickness of compound layer 13 is roughly 37 nm, and the thickness of confinement structure 8 is roughly 50 nm. Due to the bottleneck and the termination of crystal defects at the interfaces between the growth front of epitaxially grown compound 13 and silicon oxide, thin defect-free area 16 is obtained.

Figure 20:
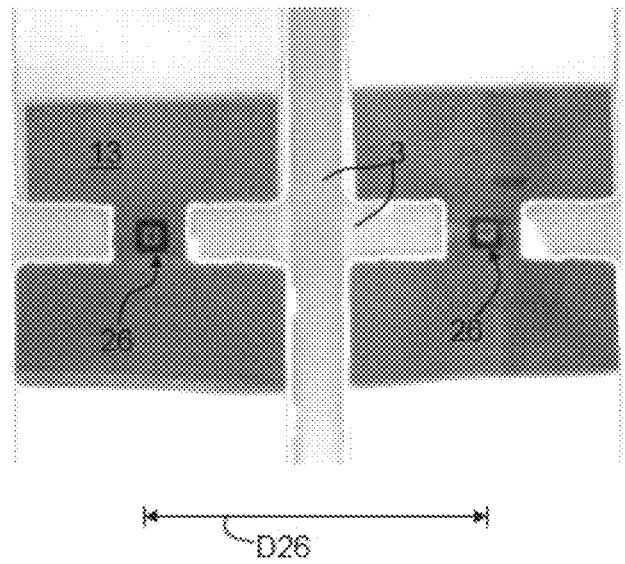
FIG. 20 shows a plain-view transmission electron microscope (TEM) image of an embodiment of a semiconductor structures.

Finally, FIG. 20 shows a detail of a compound semiconductor structure on a silicon substrate. The image reproduces a status where the compound material is still present over the seeds and is eventually removed by etching. FIG. 2 depicts two silicon seed regions 26 from where compound material 13 is grown. Grey bars 3 correspond to the dielectric layer separating compound semiconductor material 13 from the silicon substrate that is not visible in FIG. 20 (below the dielectric layer 3). The distance between seeds 26 correspond to openings 4 and is labeled as D26 in FIG. 20 and roughly amounts to 1 micrometer.

The proposed methods and devices provide for a technique that allows a confined epitaxial lateral overgrowth to form III-V semiconductor compound layers on silicon substrates. Consequently, III-V compound semiconductor integration with silicon-based devices is facilitated.

The disclosed semiconductor structures can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input device, and a central processor.

In methods embodying the invention, compound semiconductor material can initially grow on the bottom of the opening and eventually reaching the top of the sidewalls thereby overgrowing the opening in the dielectric layer. A confinement structure may provide for a growth confinement so that the overgrowth of the compound semiconductor material occurs predominantly laterally filling the confinement region. In embodiments, the confinement region may be essentially flat and can be defined by the distance between the dielectric layer and a surface of the confinement structure in parallel to the dielectric layer. Generally, when growing compound materials on a lattice-mismatched silicon substrate, crystalline defects are formed at specific angles. The defects may terminate at the sidewalls of the opening in the dielectric and at a surface of the confinement structure facing towards the opening. For example, the confinement structure includes a dielectric material, e.g. silicon oxide.

According to an embodiment the confinement structure is provided or formed in a spaced relationship with the dielectric layer and the bottom of the opening, thereby forming the confinement region. According to an embodiment, the confinement region extends above and laterally from the sidewalls of the opening between the confinement structure and the dielectric layer.

In embodiments, the confinement structure includes a cap confinement portion arranged essentially in parallel to the surface of the dielectric layer at a predetermined distance. The distance can be, for example, between 5 and 100 nm. In some embodiments, the distance is between 5 and 50 nm and more specifically between 20 and 40 nm. In some embodiments specifically suitable for the manufacture of planar devices the distance is between 5 and 15 nm.

In embodiments of the method growing the compound semiconductor material can include the step of overgrowing the opening with the compound semiconductor material, thereby forming a crystalline compound semiconductor layer on the dielectric layer extending laterally from the opening, and the crystalline compound semiconductor layer being confined by the cap confinement portion. The bottom can be considered a growth seed for the crystalline compound material.

The cap confinement portion, for example, has a lateral extension of 0.2 to 5 micrometer.

The method may include the step of removing at least partially the confinement structure. By removing the confinement structure one can make the compound semiconductor layer accessible for further processing or structuring.

In other embodiments of the method, a step of removing at least partially the crystalline compound semiconductor material in the opening is executed. When removing the crystalline compound semiconductor material in the opening one can interrupt an electric coupling between the compound semiconductor and the silicon substrate. Hence, an isolation of the compound material and the lattice-mismatched silicon is obtained.

In embodiments of the method forming the confinement structure can include the steps of: forming a sacrificial layer covering the opening and at least partially covering the dielectric layer; forming a cap layer on the sacrificial layer for forming the cap confinement portion and removing the sacrificial layer for forming the confinement region.

A sacrificial layer, for example, can be used to fabricate the confinement structure, wherein the sacrificial layer essentially fills out the space of the eventually grown compound semiconductor material. The sacrificial layer can include an amorphous material, such as amorphous silicon, for example.

In embodiments, the confinement structure includes a plurality of spacer portions arranged between the dielectric layer and the cap confinement portion. The cap confinement portion, for example, can be self-supporting structure resting on the space of or the portion. Self-supporting is to be construed as not collapsing under its own weight. A self supporting structure is sufficiently rigid to not collapse at between spacer portions. Hence, an essentially flat volume or cavity can be obtained as a confinement structure, wherein a lower confinement surface is realized by the dielectric layer and another confinement surface is realized by the cap confinement portion facing the dielectric layer on the substrate.

In embodiments, the dielectric layer and/or the confinement structure includes silicon oxide. In particular, when using indium gallium arsenide as a compound semiconductor material, crystal defects may terminate at the interface between the compound semiconductor material and the dielectric surface.

In other embodiments, the confinement structure includes an inlet for inserting compound semiconductor material into the confinement region, wherein the inlet is arranged at a predetermined lateral distance from the opening. In particular, the inlet is arranged in a region which is not opposite to the opening in the cap confinement portion. The inlet allows for inserting the compound semiconductor material for crystal growth in the confinement region, i.e. the void or cavity. The inlet can also facilitate the removal of a sacrificial material used for forming the cap layer portion.

The method can further include a step of processing the crystalline compound semiconductor material for fabricating electronic or optical devices. One can also contemplate of planarizing a surface of the crystalline compound semiconductor material prior to lithographic or other processing. However, in many embodiments the surface roughness is already very low, so that a specific surface treatment is not necessary.

The present invention also presents a semiconductor structure manufactured according to a method as disclosed above or below with respect to specific examples.

The semiconductor structure is in particular suitable for being processed and integrated with other devices that are based on silicon processing technology. Optionally, the method may include further processing the crystalline compound semiconductor material for fabricating electronic or optical devices.

In particular, due to the confined epitaxial lateral overgrowth in the confinement region, only a limited amount of compound semiconductor material is needed to form the crystalline semiconductor compound layer. Conventionally, overgrowth can be used in ART techniques, however, this requires further planarizing and reducing the thickness of overgrown compound material.

The device is suitable for forming the above- or below-mentioned semiconductor structures including crystalline silicon material as a substrate and a crystalline compound semiconductor material as an active material.

Further, a wafer structure including a plurality of semiconductor structures or devices as explained above or below with respect to specific examples disclosed.

The semiconductor structure may include two different types of crystalline semiconductor materials and provides a crystalline system suitable for further processing, for example for realizing electronic devices. Some problems incurring with lattice-mismatched semiconducting materials are overcome by having the confined epitaxial lateral overgrowth (CELO) of the opening with compound material. The proposed semiconductor structure shows low defect densities in the crystalline compound preferably below $10^7/cm^2$.

In embodiments of the semiconductor structure, an aspect ratio of the depth to the width of the opening is at least one. In preferred embodiments, the aspect ratio is at least two and in particularly preferred embodiments, the aspect ratio is larger than three. Generally, the density of crystalline defects propagating from the bottom of the opening upwards decreases. The defects decrease in the growth direction of the second semiconductor material as defects may terminate at the sidewalls and are directed in a lateral direction with respect to the growth direction.

In embodiments of the semiconductor structure, the substrate includes a crystalline semiconductor material including a silicon substrate oriented along the (001) direction.

Further, a wafer structure including a plurality of semiconductor structures as mentioned before is disclosed. For example, a wafer can include a plurality of confinement regions where compound semiconductor material is grown wherein the interface between the wafer material and the epitaxial overgrown compound material is at least partially given by a crystalline oxide material.

The compound semiconductor material preferably includes a III-V compound semiconductor material, a II-VI compound semiconductor material, and/or a IV-IV compound semiconductor material. For example, the compound semiconductor material is $In_x(Ga,Al)(1-x)As$ where $0<x<1$, InP, GaP, InSb, GaSb, ZnSe, CdTe, SiC, SiGe and/or GaN. In particular, InGaAs and/or GaAs has a higher carrier mobility than silicon and allows for fast semiconductor devices.

In some embodiments of the semiconductor structure the compound semiconductor material is replaced by germanium (Ge). Although, Ge is strictly not a compound semiconductor, the disclosed features for a semiconductor structure and the methods may also hold for Ge-based devices.

Certain embodiments of the presented semiconductor structure and the method for fabricating a semiconductor structure may include individual or combined features, method steps or aspects as mentioned above or below with respect to exemplary embodiments.

What is claimed is:

1. A method for fabricating a semiconductor structure comprising:
   providing a crystalline silicon substrate;
   defining an opening in a dielectric layer on the crystalline silicon substrate, the opening having sidewalls and a bottom wherein the bottom corresponds to a surface of the crystalline silicon substrate;
   providing a confinement structure above the dielectric layer, thereby forming a confinement region between the confinement structure and the dielectric layer; and
   growing a crystalline compound semiconductor material in the confinement region, thereby at least partially filling the confinement region.

2. The method of claim 1, wherein the confinement structure comprises a cap confinement portion arranged essentially in parallel to a surface of the dielectric layer at a predetermined distance.

3. The method of claim 2, wherein forming the confinement structure comprises:
   forming a sacrificial layer covering the opening and at least partially covering the dielectric layer;
   forming a cap layer on the sacrificial layer for forming the cap confinement portion; and
   removing the sacrificial layer for forming the confinement region.

4. The method of claim 3, wherein the sacrificial layer comprises an amorphous semiconductor material.

5. The method of claim 3, wherein the confinement structure comprises a dielectric material.

6. The method of any one of claim 3, wherein the confinement structure comprises an inlet that is arranged at a predetermined lateral distance from the opening for inserting compound semiconductor material into the confinement region.

7. The method of claim 3, wherein the confinement structure is formed in a spaced relationship with the dielectric layer and the bottom of the opening, thereby forming the confinement region that extends above and laterally from the sidewalls of the opening between the confinement structure and the dielectric layer.

8. The method of claim 2, wherein the confinement structure comprises a plurality of spacer portions arranged between the dielectric layer and the cap confinement portion.

9. The method of claim 8, wherein the cap layer is a self-supporting structure resting on the spacer portions.

10. The method of claim 1, wherein growing the compound semiconductor material comprises:

overgrowing the opening with the compound semiconductor material, thereby forming a crystalline compound semiconductor layer on the dielectric layer extending laterally from the opening, and the crystalline compound semiconductor layer being confined by the cap confinement portion.

11. The method of claim 1, further comprising: removing at least partially the confinement structure.

12. The method of claim 1, further comprising: removing at least partially the crystalline compound semiconductor material in the opening.

13. The method of claim 1, wherein the dielectric layer and/or the confinement structure comprises silicon oxide.

14. The method of claim 1, wherein the bottom of the opening acts as a growth seed for growing the crystalline compound semiconductor material.

15. The method of claim 1, wherein the crystalline compound semiconductor material includes a III-V compound semiconductor material, a II-VI compound semiconductor material, and/or a IV-IV compound semiconductor material.

16. The method of claim 1, further comprising: processing the crystalline compound semiconductor material for fabricating electronic or optical devices.

17. A device for crystalline compound semiconductor growth comprising:
a substrate comprising crystalline silicon material;
a dielectric layer on the crystalline silicon substrate having an opening, the opening having sidewalls and a bottom wherein the bottom corresponds to a surface of the crystalline silicon substrate, and wherein the bottom acts as a growth seed for a compound semiconductor material; and
a confinement structure in a spaced relationship with the dielectric layer and the bottom of the opening thereby forming a confinement region, wherein the confinement region extends laterally from the sidewalls of the opening between the confinement structure and the dielectric layer.

* * * * *